United States Patent
Hornstein et al.

(10) Patent No.: US 9,606,184 B2
(45) Date of Patent: Mar. 28, 2017

(54) METHOD AND CIRCUIT UNIT FOR DETERMINING FAULT STATES IN A HALF-BRIDGE CIRCUIT

(71) Applicant: Conti Temic microelectronic GmbH, Nuremberg (DE)

(72) Inventors: Christoph Hornstein, Nuremberg (DE); Ulrich Bley, Rackwitz (DE); Kai Kuehnen, Nuremberg (DE)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 0 days.

(21) Appl. No.: 14/432,613

(22) PCT Filed: Oct. 15, 2013

(86) PCT No.: PCT/EP2013/071502
§ 371 (c)(1),
(2) Date: Mar. 31, 2015

(87) PCT Pub. No.: WO2014/063955
PCT Pub. Date: May 1, 2014

(65) Prior Publication Data
US 2015/0276875 A1    Oct. 1, 2015

(30) Foreign Application Priority Data
Oct. 22, 2012 (DE) .......... 10 2012 219 243

(51) Int. Cl.
*G01R 31/02* (2006.01)
*G01R 31/327* (2006.01)
(Continued)

(52) U.S. Cl.
CPC .......... *G01R 31/327* (2013.01); *G01R 31/26* (2013.01); *G01R 31/28* (2013.01); *H02M 1/38* (2013.01); *H03K 17/18* (2013.01)

(58) Field of Classification Search
CPC .. F15B 2211/30575; G05B 2219/37273; H03J 1/187; H03K 2217/0045; H03K 2217/96075; H03M 2201/822
(Continued)

(56) References Cited

U.S. PATENT DOCUMENTS

| | | | |
|---|---|---|---|
| 5,119,312 A | 6/1992 | Groger et al. | ................... 702/60 |
| 6,056,384 A * | 5/2000 | Sato | ........................ G01R 31/42 318/400.21 |

FOREIGN PATENT DOCUMENTS

| | | | |
|---|---|---|---|
| DE | 4301605 C1 | 5/1994 | ............. H02M 1/08 |
| DE | 10249568 A1 | 5/2004 | ............. G01R 31/02 |

(Continued)

OTHER PUBLICATIONS

Van den Keybus, J. et al., "Protection of Digitally Controlled Inverter Units in Rapid Prototyping Applications," Applied Power Electronics Conference and Exposition, 20th Annual IEEE, pp. 1105-1111 (7 pages), Mar. 6, 2005.
(Continued)

*Primary Examiner* — Jermele M Hollington
*Assistant Examiner* — Demetrius Pretlow
(74) *Attorney, Agent, or Firm* — Slayden Grubert Beard PLLC (57) ABSTRACT

A method is disclosed for determining fault states in a half-bridge circuit having at least a first semiconductor switch and a second semiconductor switch are connected in series with one another and each controllable by a control signal to switch between an open and a closed switching state. For each of the first and second semiconductor switches, an actual switching state and a setpoint switching state are determined. A bridge short circuit in the half-bridge circuit is identified if both (a) the actual switching state of the first semiconductor switch is different than the setpoint switching state of the first semiconductor switch and (b) the actual switching state of the second semiconductor switch is
(Continued)

different than the setpoint switching state of the second semiconductor switch.

13 Claims, 3 Drawing Sheets (51) Int. Cl.
    *H03K 17/18*     (2006.01)
    *H02M 1/38*     (2007.01)
    *G01R 31/26*     (2014.01)
    *G01R 31/28*     (2006.01)

(58) Field of Classification Search
    USPC ......... 324/706, 725, 415–424, 762.01–762.1
    See application file for complete search history.

(56) References Cited

U.S. PATENT DOCUMENTS

| | | | |
|---|---|---|---|
| 6,331,941 B1* | 12/2001 | Smith | G01R 31/025 318/434 |
| 6,851,077 B2 | 2/2005 | Herzer et al. | 714/718 |
| 2003/0218848 A1* | 11/2003 | Klippel | H02J 3/005 361/100 |
| 2004/0263201 A1 | 12/2004 | Kiep | 324/762.08 |
| 2007/0046274 A1 | 3/2007 | Matsuoka | 323/283 |
| 2009/0322426 A1* | 12/2009 | Nyboe | H03F 1/52 330/251 |
| 2011/0058826 A1* | 3/2011 | Jeong | G03G 15/5004 399/33 |
| 2012/0181961 A1 | 7/2012 | Kono et al. | 318/400.21 |
| 2012/0200248 A1* | 8/2012 | Schleser | B60L 3/003 318/490 |

FOREIGN PATENT DOCUMENTS

| | | | | |
|---|---|---|---|---|
| DE | 102006039303 A1 | 3/2007 | ............. | H02H 7/122 |
| EP | 0388850 A2 | 9/1990 | ............. | H02H 7/12 |
| GB | 2429347 A | 2/2007 | ............. | B60K 28/12 |
| WO | 2014/063955 A1 | 5/2014 | ............. | H01H 47/00 |

OTHER PUBLICATIONS

International Search Report and Written Opinion, Application No. PCT/EP2013/071502, 11 pages, Dec. 13, 2013.

* cited by examiner

METHOD AND CIRCUIT UNIT FOR DETERMINING FAULT STATES IN A HALF-BRIDGE CIRCUIT

CROSS-REFERENCE TO RELATED APPLICATIONS

This application is a U.S. National Stage Application of International Application No. PCT/EP2013/071502 filed Oct. 15, 2013, which designates the United States of America, and claims priority to DE Application No. 10 2012 219 243.3 filed Oct. 22, 2012, the contents of which are hereby incorporated by reference in their entirety.

TECHNICAL FIELD

The invention relates to a method and a circuit unit for determining fault states in a half-bridge circuit having at least a first semiconductor switch and a second semiconductor switch.

BACKGROUND

A method and an arrangement for monitoring the activation and deactivation of a controllable power semiconductor component in a power electronic circuit are known from DE 43 01 605 C1. Control signals for the power semiconductor component are fed in an electrically isolated manner to a gate electrode. With a control signal for activating the power semiconductor component, counting signals are formed from level changes in the signal applied to the gate electrode and the level changes on an output electrode in the event of switchover of the power semiconductor component. The counting signals are summed and compared with a predefined counting value assigned to the fault-free mode of operation of the power semiconductor component. A fault is signaled in the event of a difference between the sum of the counting signals and the predefined counting value.

SUMMARY

One embodiment provides a method for determining fault states in a half-bridge circuit having at least a first semiconductor switch and a second semiconductor switch, wherein the first semiconductor switch and the second semiconductor switch are connected to one another in a series circuit and are controllable in each case by means of a control signal, and wherein the first semiconductor switch and the second semiconductor switch can in each case assume an open and a closed switching state, and wherein the method has the following steps: determining an actual switching state and a reference switching state of the first semiconductor switch, determining an actual switching state and a reference switching state of the second semiconductor switch, and detecting a bridge short circuit in the half-bridge circuit if the actual switching state of the first semiconductor switch is different from the reference switching state of the first semiconductor switch and moreover the actual switching state of the second semiconductor switch is different from the reference switching state of the second semiconductor switch.

In a further embodiment, the reference switching state of a semiconductor switch of the first and second semiconductor switches is closed, and wherein the reference switching state of the further semiconductor switch of the first and second semiconductor switches is open, and wherein a bridge short circuit in the half-bridge circuit is detected if the actual switching state of the semiconductor switch that is closed in the reference switching state is open and furthermore the actual switching state of the semiconductor switch that is open in the reference switching state is closed.

In a further embodiment, a number of detected bridge short circuits is furthermore determined, and wherein, if the determined number of detected bridge short circuits exceeds a predefined threshold value, the first semiconductor switch and the second semiconductor switch are switched to a predefined operating state.

In a further embodiment, the first semiconductor switch is controllable by means of a first circuit arrangement and wherein the second semiconductor switch is controllable by means of a second circuit arrangement, and wherein the actual switching state of the first semiconductor switch is determined by means of the first circuit arrangement and the actual switching state of the second semiconductor switch is determined by means of the second circuit arrangement.

In a further embodiment, the actual switching state of the first semiconductor switch is transmitted by means of a first signal via a first signal line from the first circuit arrangement to a central control unit of the half-bridge circuit and the actual switching state of the second semiconductor switch is transmitted by means of a second signal via a second signal line from the second circuit arrangement to the central control unit, and wherein the bridge short circuit is detected by means of the central control unit on the basis of the transmitted first and second signals.

In a further embodiment, a fault state in the first semiconductor switch is furthermore detected by means of the central control unit if the actual switching state of the first semiconductor switch is different from the reference switching state of the first semiconductor switch and furthermore the actual switching state of the second semiconductor switch matches the reference switching state of the second semiconductor switch, and wherein a fault state in the second semiconductor switch is furthermore detected by means of the central control unit if the actual switching state of the second semiconductor switch is different from the reference switching state of the second semiconductor switch and moreover the actual switching state of the first semiconductor switch matches the reference switching state of the first semiconductor switch.

In a further embodiment, a switching request from the central control unit for a switching of an instantaneously open semiconductor switch of the first and second semiconductor switches to the closed switching state is furthermore transmitted to the circuit arrangement of the semiconductor switch to be switched, and wherein, after the switching request has been received by the circuit arrangement of the semiconductor switch to be switched, a first time measurement of a time-measuring unit of the circuit arrangement is started, and wherein the actual switching state of the semiconductor switch to be switched is determined after the start of the first time measurement, and wherein the determined actual switching state is transmitted via the signal line of the semiconductor switch to be switched to the central control unit after a predefined time period following the start of the first time measurement.

In a further embodiment, a second time measurement of a second time-measuring unit of the central control unit is furthermore started as soon as the switching request is made by the central control unit, and wherein it is determined whether the actual switching state of the semiconductor switch that is transmitted to the central control unit switches from the open switching state to the closed switching state within a predefined time interval following the start of the second time measurement.

In a further embodiment, a fault state is detected by the central control unit if the actual switching state transmitted to the central control unit does not change over from the open switching state to the closed switching state within the predefined time interval following the start of the second time measurement.

In a further embodiment, a fault state in the time-measuring unit of the circuit arrangement is detected by the central control unit if the actual switching state transmitted to the central control unit changes over from the open switching state to the closed switching state before the predefined time interval following the start of the second time measurement.

Another embodiment provides a circuit unit for determining fault states in a half-bridge circuit having a first semiconductor switch and a second semiconductor switch, wherein the first semiconductor switch and the second semiconductor switch are connected to one another in a series circuit and wherein the first semiconductor switch and the second semiconductor switch can in each case assume an open and a closed switching state, having: a first determination unit for determining an actual switching state of the first semiconductor switch, a second determination unit for determining an actual switching state of the second semiconductor switch, a central control unit for determining a reference switching state of the first semiconductor switch and a reference switching state of the second semiconductor switch and for controlling the first semiconductor switch and the second semiconductor switch in each case by means of a control signal, a fault determination unit for detecting a bridge short circuit in the half-bridge circuit if the actual switching state of the first semiconductor switch is different from the reference switching state of the first semiconductor switch and moreover the actual switching state of the second semiconductor switch is different from the reference switching state of the second semiconductor switch.

In a further embodiment, the circuit unit further comprises: a first circuit arrangement for controlling the first semiconductor switch, wherein the first circuit arrangement has the first determination unit, a second circuit arrangement for controlling the second semiconductor switch, wherein the second circuit arrangement has the second determination unit, wherein the actual switching state of the first semiconductor switch is transmittable by means of a first signal via a first signal line from the first circuit arrangement to the central control unit and the actual switching state of the second semiconductor switch is transmittable by means of a second signal via a second signal line from the second circuit arrangement to the central control unit, and wherein the central control unit has the fault determination unit and is designed to detect the bridge short circuit on the basis of the first and second signals.

In a further embodiment, the central control unit is designed to detect a fault state in the first semiconductor switch if the actual switching state of the first semiconductor switch is different from the reference switching state of the first semiconductor switch and moreover the actual switching state of the second semiconductor switch matches the reference switching state of the second semiconductor switch, and wherein the central control unit is designed to detect a fault state in the second semiconductor switch if the actual switching state of the second semiconductor switch is different from the reference switching state of the second semiconductor switch and moreover the actual switching state of the first semiconductor switch matches the reference switching state of the first semiconductor switch.

In a further embodiment, the circuit unit further comprises: a first time-measuring unit to start a first time measurement after a switching request from the central control unit has been received by the first circuit arrangement for a switching of the first semiconductor switch to the closed switching state, a second time-measuring unit to start a second time measurement as soon as a switching request is made by the central control unit for a switching of the first semiconductor switch or the second semiconductor switch to the closed switching state, and a third time-measuring unit to start a third time measurement after a switching request from the central control unit has been received by the second circuit arrangement for a switching of the second semiconductor switch to the closed switching state, wherein the actual switching state of the first semiconductor switch is transmittable by means of the first signal via the first signal line from the first circuit arrangement to the central control unit after a predefined time period following the start of the first time measurement, and wherein the actual switching state of the second semiconductor switch is transmittable by means of the second signal via the second signal line from the second circuit arrangement to the central control unit after a predefined time period following the start of the third time measurement.

In a further embodiment, the central control unit is designed to detect a fault state if the actual switching state of the first semiconductor switch or the second semiconductor switch transmitted to the central control unit does not change over from the open switching state to the closed switching state within a predefined time interval following the start of the second time measurement.

BRIEF DESCRIPTION OF THE DRAWINGS

Embodiments of the invention are explained in detail below with reference to the attached figures, in which.

DETAILED DESCRIPTION

Embodiments of the invention provide a method and a circuit unit for determining fault states in a half-bridge circuit having at least a first semiconductor switch and a second semiconductor switch, enabling increased operational reliability for the operation of the half-bridge circuit.

A method for determining fault states in a half-bridge circuit having at least a first semiconductor switch and a second semiconductor switch, wherein the first semiconductor switch and the second semiconductor switch are connected to one another in a series circuit and are controllable in each case by means of a control signal, in particular a pulse-width-modulated control signal, and wherein the first semiconductor switch and the second semiconductor switch can in each case assume an open and a closed switching state, has, according to one aspect of the invention, the following steps. An actual switching state and a reference switching state of the first semiconductor switch are determined. Moreover, an actual switching state and a reference switching state of the second semiconductor switch are determined. Furthermore, a bridge short circuit in the half-bridge circuit is detected if the actual switching state of the first semiconductor switch is different from the reference switching state of the first semiconductor switch and moreover the actual switching state of the second semiconductor switch is different from the reference switching state of the second semiconductor switch.

A bridge short circuit is understood here and below to mean an electrical short circuit in the load path through the first and the second semiconductor switch. Furthermore, the closed switching state is understood to mean a state of the respective semiconductor switch in which an electrically conducting channel and therefore an electrical connection is formed via the semiconductor switch. The open switching state is understood accordingly to mean a state of the respective semiconductor switch in which no electrically conducting channel and therefore no electrical connection is formed via the semiconductor switch.

The method according to the aforementioned embodiment enables increased operational reliability for the operation of the half-bridge circuit. This occurs in particular through the detection of a bridge short circuit in the half-bridge circuit if the actual switching state of the first semiconductor switch is different from the reference switching state of the first semiconductor switch and furthermore the actual switching state of the second semiconductor switch is different from the reference switching state of the second semiconductor switch. A bridge short circuit is thus detected in the half-bridge circuit if it is determined that the instantaneous actual switching state of the first semiconductor switch is different from the instantaneous reference switching state of the first semiconductor switch and moreover the instantaneous actual switching state of the second semiconductor switch is different from the instantaneous reference switching state of the second semiconductor switch. Both semiconductor switches of the half-bridge circuit do not therefore assume the respective reference switching state. It is assumed here that both the first semiconductor switch and the second semiconductor switch do not assume the corresponding reference switching state only in the event of a bridge short circuit, as will be explained in more detail below. The occurrence of a bridge short circuit can thus be reliably inferred by means of the aforementioned method in such a case. Furthermore, safety requirements for safety-related electrical or electronic systems, particularly in vehicle applications, can thereby be met, wherein a distinction needs to be made between a bridge short circuit and other fault states which in each case relate to only one of the semiconductor switches, as will similarly be explained in more detail below.

The actual switching state and the reference switching state of the first semiconductor switch are determined in a temporal relationship with the determination of the actual switching state and the reference switching state of the second semiconductor switch. For example, the actual switching state and the reference switching state of the first semiconductor switch are determined essentially simultaneously with the determination of the actual switching state and the reference switching state of the second semiconductor switch, and a bridge short circuit is therefore detected in the half-bridge circuit if the actual switching state of the first semiconductor switch is different from the reference switching state of the first semiconductor switch and the actual switching state of the second semiconductor switch is simultaneously different from the reference switching state of the second semiconductor switch.

In one embodiment, the reference switching state of a semiconductor switch of the first and second semiconductor switches is closed and the reference switching state of the further semiconductor switch of the first and second semiconductor switches is open. A bridge short circuit in the half-bridge circuit is detected if the actual switching state of the semiconductor switch that is closed in the reference switching state is open and furthermore the actual switching state of the semiconductor switch that is open in the reference switching state is closed. The actual switching state of the semiconductor switch that is open in the reference switching state remains closed, for example, due to a failure of the semiconductor switch. If the further semiconductor switch is closed in this case and a bridge short circuit is therefore produced, it cannot carry the resulting high short-circuit current and therefore switches back to the open switching state. The occurrence of a bridge short circuit can therefore again be inferred in such a case.

Furthermore, a number of detected bridge short circuits is preferably determined. If the determined number of detected bridge short circuits exceeds a predefined threshold value, the first semiconductor switch and the second semiconductor switch and therefore the half-bridge circuit are switched to a predefined operating state. The first semiconductor switch and the second semiconductor switch are preferably open and the half-bridge circuit is therefore typically permanently switched to a deactivated operating state.

In a further embodiment of the method, the first semiconductor switch is controllable by means of a first circuit arrangement and the second semiconductor switch is controllable by means of a second circuit arrangement. The actual switching state of the first semiconductor switch is determined in the aforementioned embodiment by means of the first circuit arrangement and the actual switching state of the second semiconductor switch is determined by means of the second circuit arrangement.

The actual switching state of the first semiconductor switch is preferably transmitted by means of a first signal via a first signal line from the first circuit arrangement to a central control unit of the half-bridge circuit. Furthermore, the actual switching state of the second semiconductor switch is transmitted by means of a second signal via a second signal line from the second circuit arrangement to the central control unit. In the aforementioned embodiment of the method, the bridge short circuit is detected by means of the central control unit on the basis of the transmitted first and second signals.

In a further embodiment of the method, a fault state in exclusively the first semiconductor switch is furthermore detected by means of the central control unit if the actual switching state of the first semiconductor switch is different from the reference switching state of the first semiconductor switch and furthermore the actual switching state of the second semiconductor switch matches the reference switching state of the second semiconductor switch. A fault state in exclusively the second semiconductor switch is furthermore detected by means of the central control unit if the actual switching state of the second semiconductor switch is different from the reference switching state of the second semiconductor switch and moreover the actual switching state of the first semiconductor switch matches the reference switching state of the first semiconductor switch. Individual faults in the first semiconductor switch or the second semiconductor switch can thus be simply differentiated from a fault state in the half-bridge circuit in the form of a bridge short circuit in which both semiconductor switches jointly have a fault state. The respective fault states are detected on the basis of the first or second signal transmitted to the central control unit. The aforementioned embodiment thus advantageously enables a differentiation of the aforementioned fault states in each case on the basis of only one signal per semiconductor switch.

Furthermore, a switching request from the central control unit for a switching of an instantaneously open semiconductor switch of the first and second semiconductor switches to the closed switching state is preferably transmitted to the circuit arrangement of the semiconductor switch to be switched. After the switching request has been received by the circuit arrangement of the semiconductor switch to be switched, a first time measurement of a time-measuring unit of the circuit arrangement of the semiconductor switch to be switched is started and the actual switching state of the semiconductor switch to be switched is determined, for example continuously, after the start of the first time measurement.

Furthermore, the determined actual switching state is transmitted via the signal line of the semiconductor switch to be switched to the central control unit after a predefined time period following the start of the first time measurement.

In a further embodiment of the method, a second time measurement of a second time-measuring unit of the central control unit is furthermore started as soon as the switching request is made by the central control unit. In the aforementioned embodiment, it is additionally determined whether the actual switching state of the semiconductor switch to be switched that is transmitted to the central control unit switches from the open switching state to the closed switching state within a predefined time interval following the start of the second time measurement.

A fault state is detected by the central control unit if the actual switching state transmitted to the central control unit does not change over from the open switching state to the closed switching state within the predefined time interval following the start of the second time measurement.

In particular, a fault state in the time-measuring unit of the circuit arrangement of the semiconductor switch to be switched is detected by the central control unit if the actual switching state transmitted to the central control unit changes over from the open switching state to the closed switching state before the predefined time interval following the start of the second time measurement.

A drift, in particular, of the time-measuring unit of the circuit arrangement of the semiconductor switch to be switched can thus be advantageously determined by means of the last-mentioned embodiments, as will be further explained below.

The invention furthermore relates to a circuit unit for determining fault states in a half-bridge circuit having at least a first semiconductor switch and a second semiconductor switch, wherein the first semiconductor switch and the second semiconductor switch are connected to one another in a series circuit and can in each case assume an open and a closed switching state. The circuit unit has a first determination unit for determining an actual switching state of the first semiconductor switch and a second determination unit for determining an actual switching state of the second semiconductor switch. Moreover, the circuit unit has a central control unit for determining a reference switching state of the first semiconductor switch and a reference switching state of the second semiconductor switch and for controlling the first semiconductor switch and the second semiconductor switch in each case by means of a control signal, in particular a pulse-width-modulated control signal. In addition, the circuit unit has a fault determination unit for detecting a bridge short circuit in the half-bridge circuit if the actual switching state of the first semiconductor switch is different from the reference switching state of the first semiconductor switch and moreover the actual switching state of the second semiconductor switch is different from the reference switching state of the second semiconductor switch.

The circuit unit has the advantages which have already been mentioned in connection with the corresponding method and which will not be described again here in order to avoid repetitions.

In one embodiment, the circuit unit furthermore has a first circuit arrangement for controlling the first semiconductor switch, wherein the first circuit arrangement has the first determination unit. Furthermore, the circuit unit has a second circuit arrangement for controlling the second semiconductor switch, wherein the second circuit arrangement has the second determination unit. The actual switching state of the first semiconductor switch is transmittable by means of a first signal via a first signal line from the first circuit arrangement to the central control unit. Furthermore, the actual switching state of the second semiconductor switch is transmittable by means of a second signal via a second signal line from the second circuit arrangement to the central control unit. In the aforementioned embodiment, the central control unit has the fault determination unit and is designed to detect the bridge short circuit on the basis of the first and second signals.

Furthermore, the central control unit is preferably designed to detect a fault state in the first semiconductor switch if the actual switching state of the first semiconductor switch is different from the reference switching state of the first semiconductor switch and moreover the actual switching state of the second semiconductor switch matches the reference switching state of the second semiconductor switch. Furthermore, the central control unit is designed to detect a fault state in the second semiconductor switch if the actual switching state of the second semiconductor switch is different from the reference switching state of the second semiconductor switch and moreover the actual switching state of the first semiconductor switch matches the reference switching state of the first semiconductor switch.

In a further embodiment, the circuit unit furthermore has a first time-measuring unit to start a first time measurement after a switching request from the central control unit has been received by the first circuit arrangement for a switching of the first semiconductor switch to the closed switching state. In addition, the circuit unit has a second time-measuring unit to start a second time measurement as soon as a switching request is made by the central control unit for a switching of the first semiconductor switch or the second semiconductor switch to the closed switching state. Furthermore, the circuit arrangement has a third time-measuring unit to start a third time measurement after a switching request from the central control unit has been received by the second circuit arrangement for a switching of the second semiconductor switch to the closed switching state. The actual switching state of the first semiconductor switch is transmittable by means of the first signal via the first signal line from the first circuit arrangement to the central control unit after a predefined time period following the start of the first time measurement. Moreover, the actual switching state of the second semiconductor switch is transmittable by means of the second signal via the second signal line from the second circuit arrangement to the central control unit after a predefined time period following the start of the third time measurement.

In a further embodiment, the central control unit is designed to detect a fault state if the actual switching state of the first semiconductor switch or the second semiconductor switch transmitted to the central control unit does not change over from the open switching state to the closed switching state within a predefined time interval following the start of the second time measurement.

The first semiconductor switch and the second semiconductor switch are, for example, designed as IGBTs, in particular as re-channel IGBTs, or as MOSFETs, in particular n-channel MOSFETs.

Furthermore, the invention relates to a power converter for providing at least one phase current for an electric motor, wherein the power converter has a circuit unit according to the aforementioned embodiments for providing the phase current.

In addition, the invention relates to a drive device for driving a vehicle with an electric motor, wherein the drive device has a circuit unit according to the aforementioned embodiments for providing at least one phase current for the electric motor.

Figure 1A:
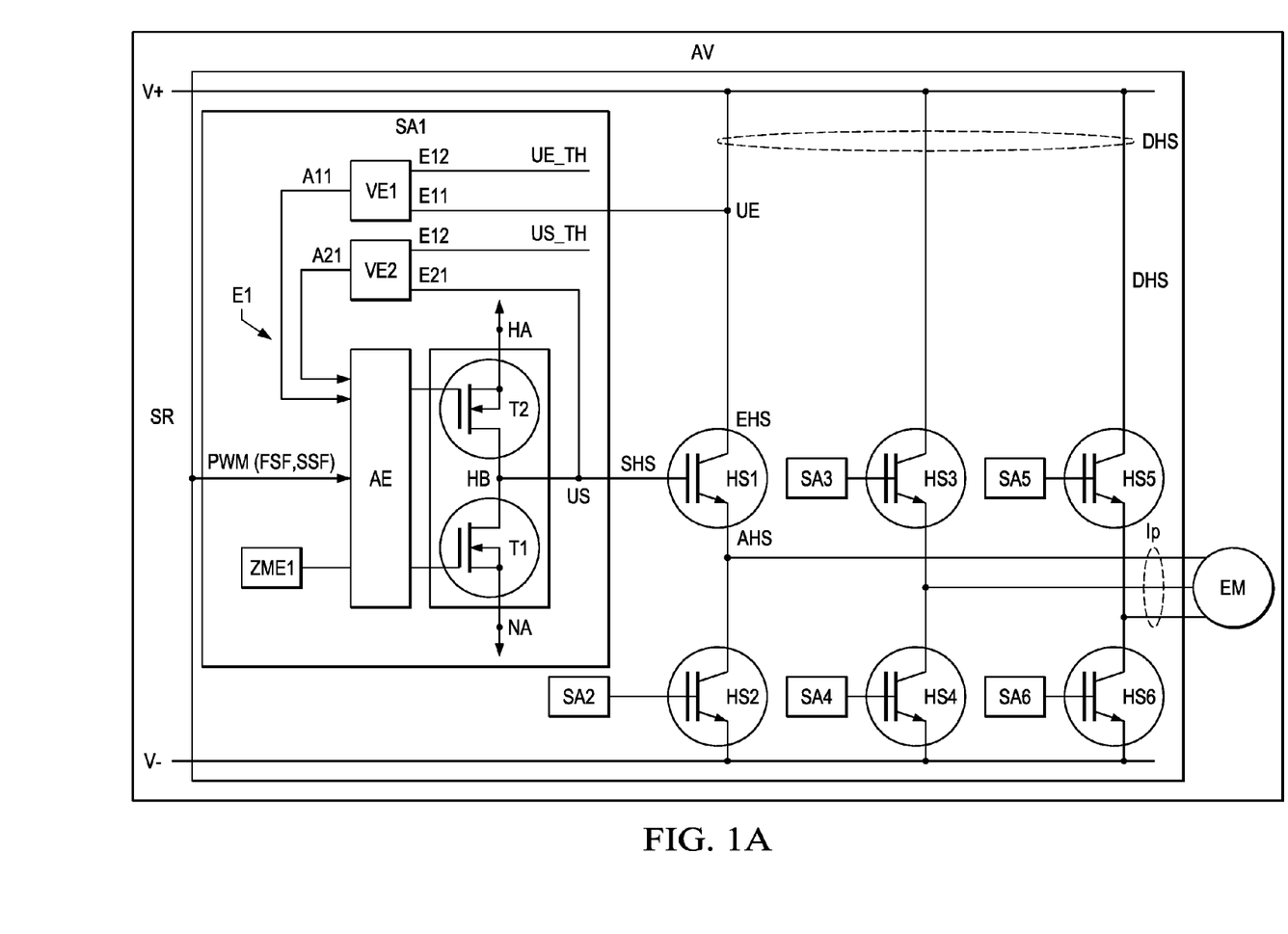
FIG. 1A shows a drive device for driving an electric or hybrid vehicle with an electric motor and a power converter in a schematic representation according to one embodiment.

FIG. 1A shows a drive device AV for driving an electric hybrid vehicle, not shown in detail in FIG. 1A, with an electric motor EM and a power converter SR in a schematic representation according to one embodiment.

The electric motor EM is mechanically coupled with a drive shaft, not shown in detail in FIG. 1A, of the vehicle for torque transmission and serves to propel the vehicle.

The power converter SR serves to provide phase currents Ip for the electric motor EM and has a triple half-bridge circuit DHS in each case with a high-side and a low-side semiconductor switch HS1 and HS2, HS3 and HS4, and HS5 and HS6 in a series circuit. Each of the six semiconductor switches HS1 to HS6 in each case has an input current connection EHS, an output current connection AHS and a load path between the input current connection EHS and the output current connection AHS to forward a load current from the input current connection EHS to the output current connection AHS and then to the electric motor EM as phase current Ip. Furthermore, the semiconductor switches HS1 to HS6 in each case have a control connection SHS via which the respective semiconductor switch HS1 to HS6 is controlled in order to enable the through-flow of the load current through the load path in the activated state of the respective semiconductor switch or to block the through-flow of the load current through the load path in the deactivated state of the respective semiconductor switch. In the embodiment shown, the semiconductor switches HS1 to HS6 are n-channel IGBTs.

For each of these six semiconductor switches HS1 to HS6, the power converter SR in each case has a circuit arrangement SA1, SA2, SA3, SA4, SA5 and SA6 to control the respective semiconductor switch HS1 to HS6, wherein the six circuit arrangements SA1 to SA6 are designed as largely functionally identical to one another. In order to simplify the description of the drive devices AV, only one of the six circuit arrangements SA1 to SA6 is described in detail below.

As with the remaining five circuit arrangements SA2 to SA6, the first circuit arrangement SA1 in the embodiment shown has a half-bridge circuit unit HB, a first comparison unit VE1, a second comparison unit VE2 and a control unit AE. The circuit arrangement SA1 is, with the exception of the half-bridge circuit unit HB, formed in an ASIC component. This enables a considerable reduction in the number of components and component costs, requires less printed circuit board space and results in lower production costs, particularly in the storage, assembly and testing of the components. Moreover, additional functionalities can be integrated. Furthermore, higher switching speeds can be set as a result, a higher reliability and an increased immunity to EMC interference are enabled and the diagnostic facilities are extended.

The half-bridge circuit unit HB for its part in each case has a first controllable driver switch T1 disposed between the control connection SHS of the semiconductor switch HS1 and a second, negative supply voltage connection NA, and a second controllable driver switch T2 disposed between the control connection SHS of the semiconductor switch HS1 and a second, positive supply voltage connection HA in a series circuit, wherein the node point between the two driver switches T1 and T2 which connects these two driver switches T1 and T2 is electrically connected to the control connection SHS of the semiconductor switch HS1 of the triple half-bridge circuit DHS. The semiconductor switch HS1 of the triple half-bridge circuit DHS is thereby switched, controlled by this half-bridge circuit unit HB. The driver switches T1 and T2, are semiconductor switches in the form of MOSFETs in the embodiment shown.

The first comparison unit VE1 has a first and a second input connection E11, E12 and an output connection A11 and is electrically connected via the first input connection E11 to the input current connection EHS of the semiconductor switch HS1. Via this first input connection E11, the first comparison unit VE1 measures the voltage potential UE on the input current connection EHS of the semiconductor switch HS1. Via the second input connection E12, the first comparison unit VE1 receives a first reference voltage potential UE_TH from a unit not shown in detail. The first comparison unit VE1 compares the measured voltage potential UE with the reference voltage potential UE_TH and, depending on the comparison result, emits an output signal on the output connection A11 which is transmitted to the control unit AE of the circuit arrangement SA1.

The second comparison unit VE2 has a first and a second input connection E21, E22 and an output connection A21 and is electrically connected via the first input connection E21 to the control connection SHS of the semiconductor switch HS1. Via this first input connection E21, the second comparison unit VE2 measures the voltage potential US on the control connection SHS of the semiconductor switch HS1. Via the second input connection E22, the second comparison unit VE2 receives a second reference voltage potential US_TH from a unit not shown in detail. The second comparison unit VE2 compares the measured voltage potential US with the reference voltage potential US_TH and, depending on the comparison result, emits an output signal on the output connection A21 which is transmitted to the control unit AE of the circuit arrangement SA1.

The first comparison unit VE1 and the second comparison unit VE2 are in each case typically designed as comparators.

The control unit AE is designed to control the semiconductor switch HS1 through controlled, for example stepwise, activation and deactivation of the two driver switches T1 and T2 using a pulse-width-modulated control signal PWM which is provided by a central control unit not shown in detail in FIG. 1A, and, in particular, using rising signal edges SSF and falling signal edges SSF of the pulse-width-modulated control signal PWM.

Furthermore, on the basis of the output signals transmitted by the first comparison unit VE1 and the second comparison unit VE2 to the control unit AE, the control unit AE determines the instantaneous actual state of the semiconductor switch HS1. A first determination unit E1 for determining the actual switching state of the first semiconductor switch HS1 is thus provided by the aforementioned components.

As will be explained in detail below, a differentiation of fault states in the three half-bridge circuits of the triple half-bridge circuit DHS can be provided on the basis of the actual switching state of the first semiconductor switch HS1 and an actual switching state of the second semiconductor switch HS2 determined in a corresponding manner. For this purpose, the first circuit arrangement SA1 furthermore has a first time-measuring unit ZME1 which is similarly described in detail below.

Figure 1B:
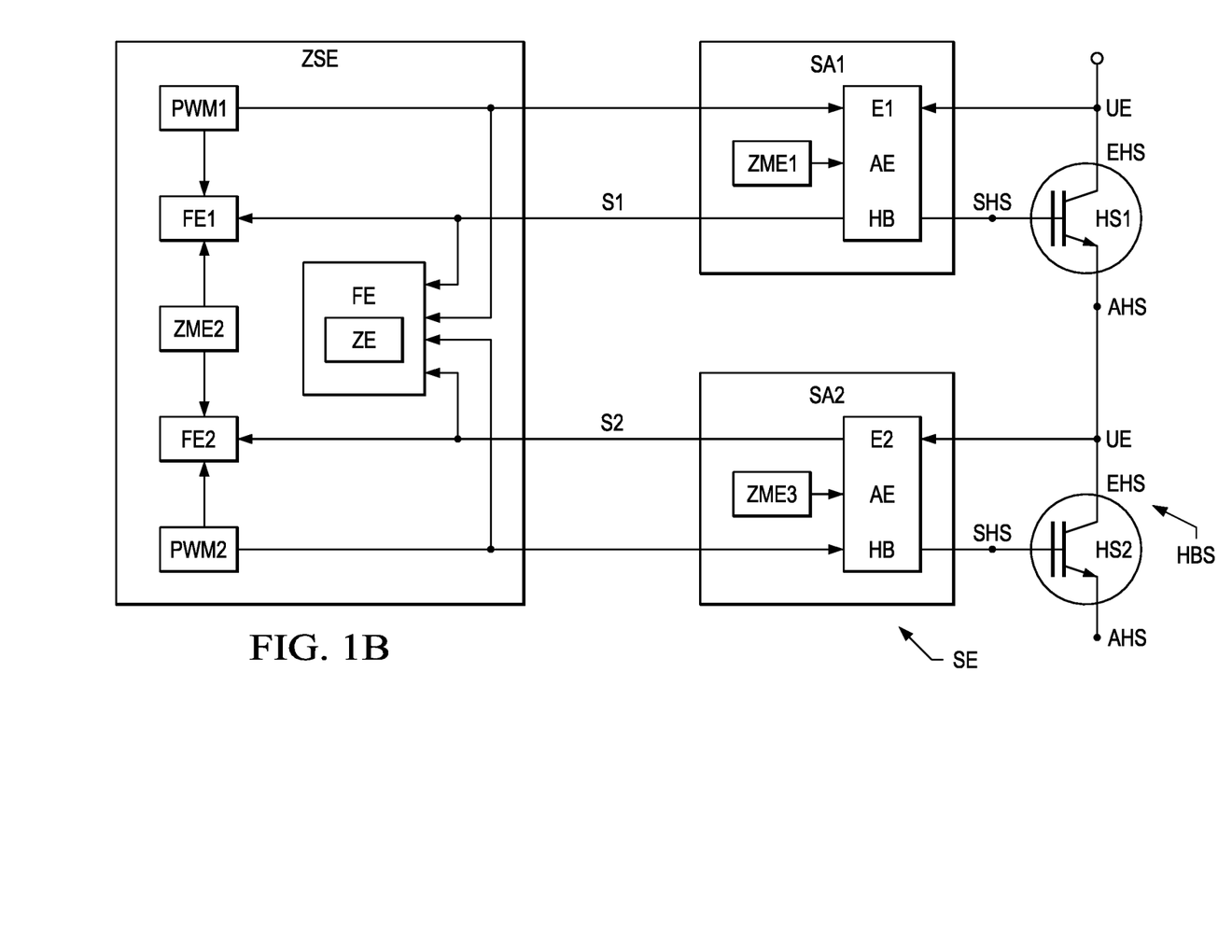
FIG. 1B shows a circuit unit for determining fault states in a half-bridge circuit according to one embodiment.

For this purpose, FIG. 1B shows a circuit unit SE for determining fault states in a half-bridge circuit HBS of the triple half-bridge circuit shown in FIG. 1A according to one embodiment. Components with the same functions as in FIG. 1A are denoted with the same reference symbols and are not explained again below. For reasons of clarity, not all components of the first circuit arrangement SA1 and the second circuit arrangement SA2 are shown in FIG. 1B. Furthermore, the first determination unit E1, the control unit AE and the half-bridge driver circuit unit HB of the first circuit arrangement SA1 are combined in a common block. Correspondingly, a second determination unit E2 for determining an actual state of the second semiconductor switch HS2, a control unit AE and a half-bridge driver circuit HB of the second circuit arrangement SA2 are combined in a block.

In addition to the first determination unit E1 for determining the actual switching state of the first semiconductor switch HS1 and the second determination unit E2 for determining the actual switching state of the second semiconductor switch HS2, the circuit unit SE has a central control unit ZSE for determining a reference switching state of the first semiconductor switch HS1 and a reference switching state of the second semiconductor switch HS2. Furthermore, the central control unit ZSE is designed to control the first semiconductor switch HS1 and the second semiconductor switch HS2 in each case by means of a pulse-width-modulated control signal. For this purpose, in the embodiment shown, the central control unit ZSE has a first pulse width modulator PWM1 and a second pulse width modulator PWM2, wherein a control signal generated by the first pulse width modulator PWM1 is supplied to the control unit AE of the first circuit arrangement SA1 and a control signal generated by the second pulse width modulator PWM2 is supplied to the control unit AE of the second circuit arrangement SA2.

Furthermore, the circuit unit SE has a fault determination unit FE for detecting a bridge short circuit in the half-bridge circuit HBS if the actual switching state of the first semiconductor switch HS1 is different from the reference switching state of the first semiconductor switch HS1 and moreover the actual switching state of the second semiconductor switch HS2 is different from the reference switching state of the second semiconductor switch HS2. For this purpose, in the embodiment shown, the actual switching state of the first semiconductor switch HS1 is transmittable by means of a first signal via a first signal line S1 from the first circuit arrangement SA1 to the central control unit ZSE and, in particular, to the fault determination unit FE. Furthermore, the actual switching state of the second semiconductor switch HS2 is transmittable by means of a second signal via a second signal line S2 from the second circuit arrangement SA2 to the central control unit ZSE and in turn, in particular, to the fault determination unit FE.

In the embodiment shown, the number of detected bridge short circuits is furthermore determined by means of a counting unit ZE. If the determined number of detected bridge short circuits exceeds a predefined threshold value, the first semiconductor switch HS1 and the second semiconductor switch HS2 are switched to a predefined operating state. In the embodiment shown, the first semiconductor switch HS1 and the second semiconductor switch HS2 two and therefore the half-bridge circuit HBS are permanently deactivated in this case.

The fault determination unit FE is furthermore designed to detect an individual fault in the first semiconductor switch HS1 if the actual switching state of the first semiconductor switch HS1 is different from the reference switching state of the first semiconductor switch HS1 and moreover the actual switching state of the second semiconductor switch HS2 matches the reference switching state of the second semiconductor switch HS2. Furthermore, the fault determination unit FE is designed to detect an individual fault in the second semiconductor switch HS2 if the actual switching state of the second semiconductor switch HS2 is different from the reference switching state of the second semiconductor switch HS2 and moreover the actual switching state of the first semiconductor switch HS1 matches the reference switching state of the second semiconductor switch HS1. The actual switching states of the two semiconductor switches HS1 and HS2 are in turn transmitted via the first signal line S1 or the second signal line S2 to the fault determination unit FE.

The circuit unit SE furthermore has a first time-measuring unit ZME1 to start a first time measurement after a switching request from the central control unit ZSE has been received by the first circuit arrangement SA1 for a switching of the first semiconductor switch HS1 to the closed switching state if the first semiconductor switch HS1 is instantaneously open. Furthermore, the circuit unit SE has a third time-measuring unit ZME3 to start a third time measurement after a switching request from the central control unit ZSE has been received by the second circuit arrangement SA2 for a switching of the second semiconductor switch HS2 to the closed switching state if the second semiconductor switch HS2 is instantaneously open. In addition, the circuit unit SE has a second time-measuring unit ZME2 to start a second time measurement as soon as a switching request is made by the central control unit ZSE for a switching of the first semiconductor switch HS1 or the second semiconductor switch HS2 to the closed switching state. The first time-measuring unit ZME1 forms part of the first circuit arrangement SA1, the third time-measuring unit ZME3 forms part of the second circuit arrangement SA2 and the second time-measuring unit ZME2 forms part of the central control unit ZSE. The first time-measuring unit ZME1, the second time-measuring unit ZME2 and the third time-measuring unit ZME3 are, for example, designed in each case in the form of a clock generator or oscillator. In particular, the aforementioned time measurements can be effected in such a way that a number of pulses with a predefined pulse duration is defined.

The actual switching state of the first semiconductor switch HS1 is transmitted after a predefined time period following the start of the first time measurement by means of the first signal via the first signal line S1 from the first circuit arrangement SA1 to the central control unit ZSE. Correspondingly, the actual switching state of the second semiconductor switch HS2 is transmitted by means of the second signal via the second signal line S2 from the second circuit arrangement SA2 to the central control unit ZSE after a predefined time period following the start of the third time measurement.

The central control unit ZSE is designed to detect a fault condition if the actual switching state of the first semiconductor switch HS1 or the second semiconductor switch HS2 transmitted to the central control unit ZSE does not change over from the open switching state to the closed switching state within a predefined time interval following the start of the second time measurement. In particular, a fault state in the first time-measuring unit ZME1 or the third time-measuring unit ZME3 can be detected by the central control unit ZSE if the actual switching state transmitted to the central control unit ZSE changes over from the open switching state to the closed switching state before the start of the predefined time interval following the start of the second time measurement, as will be explained in detail in connection with FIG. 2.

For this purpose, in the embodiment shown, the central control unit ZSE has a first fault determination unit FE1 and a second fault determination unit FE2. The actual switching state of the first semiconductor switch HS1 is transmitted via the first signal line S1 from the first circuit arrangement SA1 to the first fault determination unit FE1. Furthermore, the control signal generated by the first pulse width modulator PWM1 is transmitted to the first fault determination unit FE1. Correspondingly, the actual switching state of the second semiconductor switch HS2 is transmitted via the second signal line S2 from the second circuit arrangement SA2 to the second fault determination unit FE2, to which the control signal generated by the second pulse width modulator PWM2 is also supplied. In addition, the time period measured by the second time-measuring unit ZME2 is supplied to the first fault determination unit FE1 and to the second fault determination unit FE2. Further specific details will be explained in connection with FIG. 2.

By means of the embodiment shown, a fault state in the respective time-measuring unit, for example in the form of an oscillator drift, a status error of the respective semiconductor switch, for example a deactivation of the semiconductor switch due to a detected undervoltage, and a bridge short circuit can thus be differentiated from one another with a single signal for the respective semiconductor switch.

Figure 2:
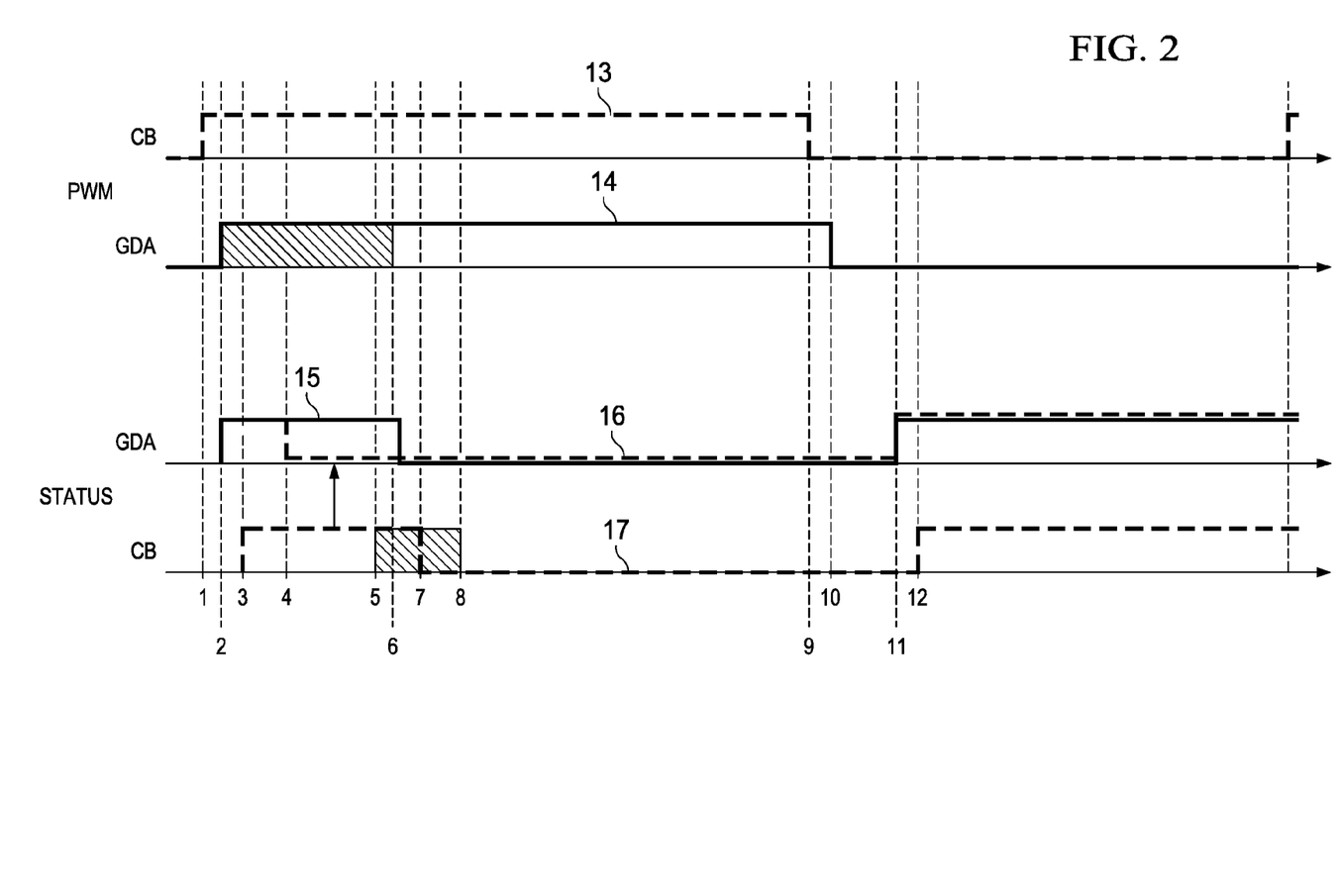
FIG. 2 shows a schematic representation of a method for determining fault states in a half-bridge circuit having a first semiconductor switch and a second semiconductor switch according to one embodiment.

FIG. 2 shows a schematic representation of a method for determining fault states in a half-bridge circuit according to one embodiment having a first semiconductor switch and a second semiconductor switch.

In FIG. 2, the variation with time in the pulse-width-modulated control signal supplied by the central control unit, which is denoted in FIG. 2 as CB (Control Board), is shown schematically by a signal 13. The pulse-width-modulated control signal received by the circuit arrangement of the semiconductor switch to be switched is shown schematically by means of a signal 14. The circuit arrangement is denoted in FIG. 2 as GDA (Gate Driver A), wherein A represents the respective semiconductor switch to be switched.

The signal transmitted from the circuit arrangement to the central control unit indicating the actual switching state of the respective semiconductor switch is shown schematically by means of a signal 15. Furthermore, the signal received by the central control unit indicating the actual switching state is shown schematically by means of a signal 17.

At a first time 1, the central control unit transmits a switching request for a switching of an instantaneously open semiconductor switch of the first and second semiconductor switches to the closed switching state to the circuit arrangement of the semiconductor switch to be switched. The central control unit thus controls an activation of the corresponding semiconductor switch via the PWM line. Moreover, a second time measurement of a time-measuring unit of the central control unit is started at this first time 1.

At a second, later time 2, the circuit arrangement of the semiconductor switch to be switched receives the activation command. The circuit arrangement receives the activation command with a time lag due to transit time delays. At this second time 2, the circuit arrangement starts a first time measurement of a time-measuring unit of the circuit arrangement. The time-measuring unit of the circuit arrangement is independent from the time-measuring unit of the central control unit.

Following the reception of the activation command, the circuit arrangement manipulates the status signal of the semiconductor switch to be transmitted to the central control unit, i.e. the signal indicating the actual switching state of the semiconductor switch, in such a way that said signal continues to indicate a deactivated state of the semiconductor switch. For this purpose, in the embodiment shown, the signal 15 is transmitted with a high level to the central control unit by the circuit arrangement between the second time 2 and a sixth time 6. The central control unit receives the signal with a high level at a third time 3, again with a time lag due to transit time delays.

At a fourth, later time 4, due to a falling signal edge in the output signal transmitted by the first comparison unit and shown in FIG. 2 by means of a signal 16, the circuit arrangement detects internally that the semiconductor switch has changed over from the open switching state to the closed switching state.

However, the determined change in the actual switching state from the open switching state to the closed switching state is transmitted to the central control unit only after a predefined time period following the start of the first time measurement. In the embodiment shown, as already explained, this takes place at the sixth time 6. Up to this sixth time 6, the signal transmitted to the central control unit indicating the actual switching state of the semiconductor switch no longer corresponds to the real actual condition of the semiconductor switch determined by the circuit arrangement.

From the sixth time 6, the signal transmitted from the circuit arrangement to the central control unit is again identical to the real actual state of the semiconductor switch.

The central control unit receives the transmitted signal change indicating a changeover from the open switching state to the closed switching state, again with a time lag, at a seventh, later time 7.

In the event of a defective operation of the semiconductor switch to be switched, the central control unit expects the signal indicating the changeover from the open switching state to the closed switching state in the transmitted signal, for example in the form of a falling signal edge, within a predefined time interval following the start of the second measurement, i.e., in the embodiment shown, in a period between a fifth time 5 and an eighth time 8.

In the representation shown, the seventh time 7 is located in the predefined time interval between the fifth time 5 and the eighth time 8. A defective operation of the semiconductor switch to be switched is thus detected by the central control unit.

Conversely, if the actual switching state transmitted to the central control unit does not change over from the open switching state to the closed switching state within the predefined time interval following the start of the second time measurement, a fault state is detected by the central control unit. In particular, a fault state in the time-measuring unit of the circuit arrangement is detected if the actual switching state transmitted to the central control unit changes over from the open switching state to the closed switching state before the start of the predefined time interval. In this case, the first time measurement is effected too quickly.

If the actual switching state transmitted to the central control unit changes over from the open switching state to the closed switching state after the end of the predefined time interval, a fault state is similarly is detected by the central control unit, wherein, in this case, both a fault state in the time-measuring unit of the circuit arrangement in the form of a time measurement that is too slow and also an internal status error of the semiconductor switch to be switched may be present.

If a fault state is detected by the central control unit, the central control unit in each case initiates the response that is safe from a system perspective.

At a ninth, later time 9, the central control unit transmits a switching request to the circuit arrangement of the semiconductor switch for a switching of the instantaneously closed semiconductor switch to the open switching state. Said circuit arrangement receives the deactivation command at a tenth, later time 10, with a time lag due to the transit time delays. At an eleventh time 11, the signal indicating the actual switching state of the semiconductor switch changes over from the closed switching state to the open switching state. In the representation shown, this takes place in the form of a rising signal edge, i.e. a changeover from a low to a high signal level in the output signal emitted by the first comparison unit. The central control unit receives this status change at a twelfth time 12, again with a time lag due to the transit time delays.

For the GDA, a deactivation of the semiconductor switch represents the safe state for each detected fault. The CB detects the fault in that, if a PWM activation command is present, the falling edge does not occur until the eighth time 8 or the status again changes over to the high signal level between the eighth time 8 and the ninth time 9 (in the case where the fault occurs during the conducting period only). The specific detection of a bridge short circuit is enabled by the CB through evaluation and comparison of both status signals of the half-bridge. Whereas any other fault is indicated via one status signal only, the bridge short circuit is signaled in the status signals of both the first and second semiconductor switches.

If, for example, the first semiconductor switch is activated and the second semiconductor switch fails while a PWM deactivation command is present, a bridge short circuit has occurred. The first semiconductor switch can no longer carry the current which is then present, becomes desaturated and is deactivated by the GDA. Its status signals this fault by changing over to the high signal level. In immediate temporal proximity to this, the status of the second semiconductor switch will signal a low signal level, i.e. conducting, although said switch should actually be deactivated. The same applies accordingly if the first semiconductor switch fails.

The different cases for the high-side and low-side switches respectively of the half-bridge are shown in the following table. PWM_HS denotes the reference switching state of the first semiconductor switch, STATUS_HS the actual switching state of the first semiconductor switch, PWM_LS the reference switching state of the second semiconductor switch, and STATUS_LS the actual switching state of the second semiconductor switch.

| PWM_HS | On | On | On | On | Off | Off | Off | Off |
|---|---|---|---|---|---|---|---|---|
| STATUS_HS | On | Off | Off | On | Off | Off | On | On |
| PWM_LS | Off | Off | Off | Off | On | On | On | On |
| STATUS_LS | Off | Off | On | On | On | Off | Off | On |
| Fault case | 0 | 1 | 2 | 3 | 0 | 1 | 2 | 3 |

Fault case 0 indicates a fault-free operation, i.e. the HS status and LS status signal back the expected value. With fault case 1, only the switch with the activation command signals back an incorrect status, i.e. a fault, whereas the deactivated switch has the expected value. A fault in the circuit arrangement of the semiconductor switch with the activation command can be inferred from this, e.g. an undervoltage. With fault case 2, both status signals indicate a fault. The deactivated switch has failed, the further switch cannot permanently carry the high short-circuit current and then switches off. Fault case 2 thus indicates a bridge short circuit, i.e. the short-circuit counter is incremented. Fault case 3 indicates a defective status return line of the deactivated switch, i.e. this switch appears permanently to signal "On". In this case, no response initially ensues.

What is claimed is:

1. A method for determining fault states in a half-bridge circuit having a first semiconductor switch and a second semiconductor switch connected to one another in a series circuit, wherein each of the first semiconductor switch and the second semiconductor switch is controllable by a control signal of a respective first and second circuit arrangement to switch between an open switching state and a closed switching state, the method comprising:
   determining an actual switching state by the first circuit arrangement and a reference switching state of the first semiconductor switch,
   determining an actual switching state by the second circuit arrangement and a reference switching state of the second semiconductor switch, and
   identifying a bridge short circuit in the half-bridge circuit in response to determining that (a) the actual switching state of the first semiconductor switch is different from the reference switching state of the first semiconductor switch and (b) the actual switching state of the second semiconductor switch is different from the reference switching state of the second semiconductor switch.

2. The method of claim 1, wherein: the reference switching state of one of the first and second semiconductor switches is closed, the reference switching state of the other one of the first and second semiconductor switches is open, and a bridge short circuit in the half-bridge circuit is detected when (a) the actual switching state of the semiconductor switch having the reference switching state of closed is open and furthermore the actual switching state of the semiconductor switch having the reference switching state of open is closed.

3. The method of claim 1, comprising: determining a number of detected bridge short circuits, and switching the first and second semiconductor switches to a predefined operating state in response to determining that the number of detected bridge short circuits exceeds a predefined threshold value.

4. The method of claim 1, wherein: the actual switching state of the first semiconductor switch is transmitted by a first signal via a first signal line from the first circuit arrangement to a central control unit of the half-bridge circuit, the actual switching state of the second semiconductor switch is transmitted by a second signal via a second signal line from the second circuit arrangement to the central control unit, and the bridge short circuit is detected by the central control unit on the basis of the transmitted first and second signals.

5. The method of claim 1, wherein: a fault state in the first semiconductor switch is detected by the central control unit if (a) the actual switching state of the first semiconductor switch is different from the reference switching state of the first semiconductor switch and (b) the actual switching state of the second semiconductor switch matches the reference switching state of the second semiconductor switch, and a fault state in the second semiconductor switch is detected by the central control unit if (a) the actual switching state of the second semiconductor switch is different from the reference switching state of the second semiconductor switch and (b) the actual switching state of the first semiconductor switch matches the reference switching state of the first semiconductor switch.

6. The method of claim 1, comprising: transmitting a switching request from the central control unit for a switching of an instantaneously open semiconductor switch of the first and second semiconductor switches to the closed switching state to the circuit arrangement of the semiconductor switch to be switched, after the switching request has been received by the circuit arrangement of the semiconductor switch to be switched, starting a first time measurement of a time-measuring unit of the circuit arrangement, determining the actual switching state of the semiconductor switch to be switched after the start of the first time measurement, and transmitting the determined actual switching state via the signal line of the semiconductor switch to be switched to the central control unit after a predefined time period following the start of the first time measurement.

7. The method of claim 6, comprising: starting a second time measurement of a second time-measuring unit of the central control unit as soon as the switching request is made by the central control unit, and determining whether the actual switching state of the semiconductor switch that is transmitted to the central control unit switches from the open switching state to the closed switching state within a predefined time interval following the start of the second time measurement.

8. The method of claim 7, comprising detecting a fault state by the central control unit if the actual switching state transmitted to the central control unit does not change over from the open switching state to the closed switching state within the predefined time interval following the start of the second time measurement.

9. The method of claim 7, comprising detecting a fault state in the time-measuring unit of the circuit arrangement by the central control unit if the actual switching state transmitted to the central control unit changes over from the open switching state to the closed switching state before the predefined time interval following the start of the second time measurement.

10. A circuit unit for determining fault states in a half-bridge circuit comprising:
a first semiconductor switch;
a second semiconductor switch;
wherein the first semiconductor switch and the second semiconductor switch are connected to one another in a series circuit, and wherein each of the first semiconductor switch and the second semiconductor switch is switchable between an open switching state and a closed switching state;
a first determination unit configured to determine an actual switching state of the first semiconductor switch and to control the first semiconductor switch;
a second determination unit configured to determine an actual switching state of the second semiconductor switch and to control the second semiconductor switch;
a central control unit configured to determine a reference switching state of the first semiconductor switch and a reference switching state of the second semiconductor switch, and to control each of the first semiconductor switch and the second semiconductor switch by a control signal; and
a fault determination unit configured to detect a bridge short circuit in the half-bridge circuit in response to determining that (a) the actual switching state of the first semiconductor switch is different from the reference switching state of the first semiconductor switch and (b) the actual switching state of the second semiconductor switch is different from the reference switching state of the second semiconductor switch;
wherein the actual switching state of the first semiconductor switch is transmittable by a first signal via a first signal line from the first circuit arrangement to the central control unit,
wherein the actual switching state of the second semiconductor switch is transmittable by a second signal via a second signal line from the second circuit arrangement to the central control unit, and
the central control unit comprises the fault determination unit and is configured to detect the bridge short circuit based on the first and second signals.

11. The circuit unit of claim 10, wherein:
the central control unit is configured detect a fault state in the first semiconductor switch if (a) the actual switching state of the first semiconductor switch is different from the reference switching state of the first semiconductor switch and (b) the actual switching state of the second semiconductor switch matches the reference switching state of the second semiconductor switch, and
the central control unit is configured to detect a fault state in the second semiconductor switch if (a) the actual switching state of the second semiconductor switch is different from the reference switching state of the second semiconductor switch and (b) the actual switching state of the first semiconductor switch matches the reference switching state of the first semiconductor switch.

12. The circuit unit of claim 10, further comprising:
a first time-measuring unit configured to start a first time measurement after a switching request from the central control unit has been received by the first circuit arrangement for a switching of the first semiconductor switch to the closed switching state,
a second time-measuring unit configured to start a second time measurement as soon as a switching request is made by the central control unit for a switching of the first semiconductor switch or the second semiconductor switch to the closed switching state, and
a third time-measuring unit configured to start a third time measurement after a switching request from the central control unit has been received by the second circuit arrangement for a switching of the second semiconductor switch to the closed switching state, wherein the actual switching state of the first semiconductor switch is transmittable by the first signal via the first signal line from the first circuit arrangement to the central control unit after a predefined time period following the start of the first time measurement, and wherein the actual switching state of the second semiconductor switch is transmittable by the second signal via the second signal line from the second circuit arrangement to the central control unit after a predefined time period following the start of the third time measurement.

13. The circuit unit claim 12, wherein the central control unit is configured to detect a fault state if the actual switching state of the first semiconductor switch or the second semiconductor switch transmitted to the central control unit does not change over from the open switching state to the closed switching state within a predefined time interval following the start of the second time measurement.

* * * * *